(12) United States Patent
Adachi et al.

(10) Patent No.: US 10,403,584 B2
(45) Date of Patent: Sep. 3, 2019

(54) ESD PROTECTION DEVICE AND METHOD FOR PRODUCING THE SAME

(71) Applicant: Murata Manufacturing Co., Ltd., Nagaokakyo-shi, Kyoto-fu (JP)

(72) Inventors: Jun Adachi, Nagaokakyo (JP); Takeshi Miki, Nagaokakyo (JP); Takahiro Sumi, Nagaokakyo (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 8 days.

(21) Appl. No.: 15/831,457

(22) Filed: Dec. 5, 2017

(65) Prior Publication Data
US 2018/0096957 A1 Apr. 5, 2018

Related U.S. Application Data

(63) Continuation of application No. PCT/JP2016/064752, filed on May 18, 2016.

(30) Foreign Application Priority Data

Jul. 1, 2015 (JP) .................................. 2015-132608

(51) Int. Cl.
| | |
|---|---|
| *H01L 23/60* | (2006.01) |
| *H01T 2/02* | (2006.01) |
| *H01T 4/10* | (2006.01) |
| *H01T 4/12* | (2006.01) |
| *H01L 27/02* | (2006.01) |
| *H01T 1/22* | (2006.01) |
| *H01T 1/20* | (2006.01) |
| *H01T 21/00* | (2006.01) |

(52) U.S. Cl.
CPC .......... *H01L 23/60* (2013.01); *H01L 27/0248* (2013.01); *H01T 1/20* (2013.01);
(Continued)

(58) Field of Classification Search
CPC ....... H01L 23/60; H01L 27/0248; H01T 1/22; H01T 4/10; H01T 1/20; H01T 21/00; H01T 4/12; C04B 2235/5436
(Continued)

(56) References Cited

U.S. PATENT DOCUMENTS

| | | |
|---|---|---|
| 8,847,726 B2 | 9/2014 | Ikeda et al. |
| 2009/0067113 A1* | 3/2009 | Urakawa ................... H01T 4/12 361/220 |

(Continued)

FOREIGN PATENT DOCUMENTS

| | | |
|---|---|---|
| JP | 2010-129320 A | 6/2010 |
| WO | 2011/096335 A1 | 8/2011 |

(Continued)

OTHER PUBLICATIONS

Official Communication issued in International Patent Application No. PCT/JP20161064752, dated Aug. 16, 2016.

*Primary Examiner* — Dzung Tran
(74) *Attorney, Agent, or Firm* — Keating & Bennett, LLP

(57) ABSTRACT

An ESD protection device includes an insulating ceramic body including a cavity, first and second discharge electrodes disposed so as to partially face each other with the cavity interposed therebetween, and a supporting electrode disposed so as to be at least partially exposed to the cavity and to be electrically connected to the first and second discharge electrodes. A void isolated from the cavity is provided in at least a portion of a boundary region between at least one of the first and second discharge electrodes, the supporting electrode, and the insulating ceramic body.

19 Claims, 5 Drawing Sheets

(52) U.S. Cl.
CPC ............... *H01T 1/22* (2013.01); *H01T 2/02* (2013.01); *H01T 4/10* (2013.01); *H01T 4/12* (2013.01); *C04B 2235/5436* (2013.01); *H01T 21/00* (2013.01)

(58) Field of Classification Search
USPC ....................................................... 257/355
See application file for complete search history.

(56) References Cited

U.S. PATENT DOCUMENTS

| | | | | |
|---|---|---|---|---|
| 2010/0254052 | A1* | 10/2010 | Katsumura | H01T 1/24 361/56 |
| 2010/0309595 | A1* | 12/2010 | Adachi | H01T 1/20 361/56 |
| 2011/0222197 | A1* | 9/2011 | Adachi | H01T 4/12 361/56 |
| 2011/0222203 | A1* | 9/2011 | Adachi | H01T 1/20 361/220 |
| 2012/0162838 | A1* | 6/2012 | Sawada | H01T 4/12 361/56 |
| 2013/0201585 | A1* | 8/2013 | Ikeda | H01T 4/12 361/56 |
| 2016/0081172 | A1* | 3/2016 | Otsubo | H01T 4/10 361/220 |

FOREIGN PATENT DOCUMENTS

| | | | | |
|---|---|---|---|---|
| WO | 2014/188802 | A1 | 11/2014 | |
| WO | WO-2014208215 | A1 * | 12/2014 | ............... H01T 4/10 |

\* cited by examiner

FIG. 8
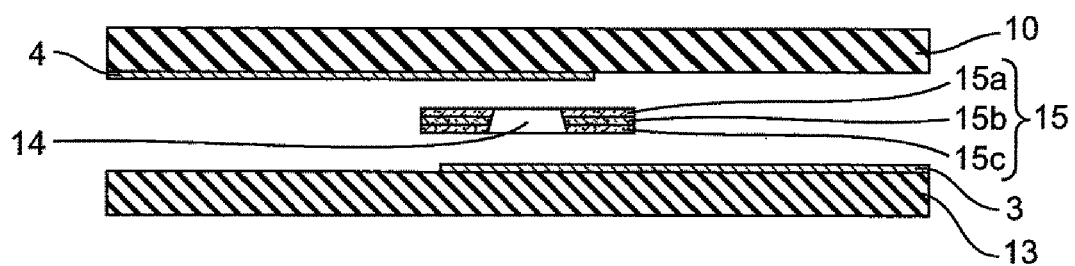
FIG. 9A  FIG. 9B  FIG. 9C
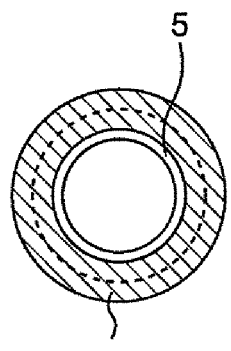
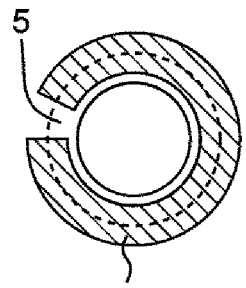
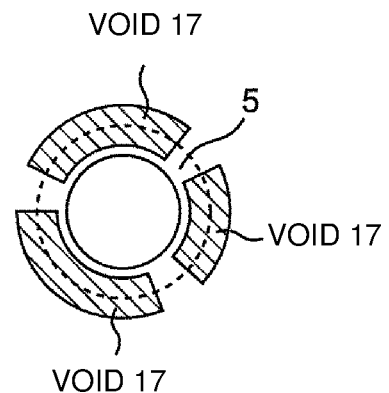

ESD PROTECTION DEVICE AND METHOD FOR PRODUCING THE SAME

CROSS REFERENCE TO RELATED APPLICATIONS

This application claims the benefit of priority to Japanese Patent Application No. 2015-132608 filed on Jul. 1, 2015 and is a Continuation Application of PCT Application No. PCT/JP2016/064752 filed on May 18, 2016. The entire contents of each application are hereby incorporated herein by reference.

BACKGROUND OF THE INVENTION

1. Field of the Invention

The present invention relates to an ESD protection device and a method for producing the ESD protection device.

2. Description of the Related Art

Electro-static discharge (ESD) is a phenomenon in which a strong discharge occurs when an electrically charged conductive object (e.g., a human body) comes into contact with or comes sufficiently close to another conductive object (e.g., an electronic device). ESD causes damage, malfunction, and other problems in electronic devices. ESD protection devices are used to prevent these problems and serve to keep an excessively high voltage generated during discharge from being applied across a circuit of an electronic device.

For example, Japanese Unexamined Patent Application Publication No. 2010-129320 discloses an ESD protection device including an insulating substrate including an inner cavity, first and second discharge electrodes, and a supporting electrode formed on at least a portion of the inner circumferential surface of the cavity and electrically connected to the first and second discharge electrodes.

Discharge in a cavity occurs primarily along the inner circumferential surface of the cavity (which is referred to as creeping discharge). In the ESD protection device disclosed in Japanese Unexamined Patent Application Publication No. 2010-129320, the configuration in which the supporting electrode is provided on at least a portion of the inner circumferential surface of the cavity facilitates the occurrence of creeping discharge, providing improved stability of ESD characteristics.

However, the inventors of the present invention have discovered that narrowing a discharge gap, in order to achieve improved low-voltage operability, increases the likelihood of degradation of a supporting electrode.

SUMMARY OF THE INVENTION

Thus, preferred embodiments of the present invention provide ESD protection devices that reduce or prevent supporting electrode degradation while providing improved low-voltage operability, and methods producing ESD protection devices.

The inventors of the present invention conducted intensive studies to solve the problems described above to discover that an electric field is concentrated at a triple point where an insulating substrate, a discharge electrode, and a supporting electrode come into contact with one another and that providing a void in a boundary region between the insulating substrate, the discharge electrode, and the supporting electrode reduces the electric field at the triple point.

An ESD protection device according to a preferred embodiment of the present invention includes an insulating ceramic body including a cavity provided therein, first and second discharge electrodes disposed so as to partially face each other with the cavity interposed therebetween, and a supporting electrode disposed so as to be at least partially exposed to the cavity and to be electrically connected to the first and second discharge electrodes. A void isolated from the cavity is provided in at least a portion of a boundary region between at least one of the first and second discharge electrodes, the supporting electrode, and the insulating ceramic body.

In an ESD protection device according to a preferred embodiment of the present invention, the configuration in which a void isolated from the cavity is provided in at least a portion of the boundary region between at least one of the first and second discharge electrodes, the supporting electrode, and the insulating ceramic body reduces the electric field concentration at a triple point where at least one of the first and second discharge electrodes, the supporting electrode, and the insulating ceramic body come into contact with one another (hereinafter referred to as an internal triple point) and promotes the electric field concentration at a triple point where at least one of the first and second discharge electrodes, the cavity, and the supporting electrode come into contact with one another (hereinafter referred to as a creepage surface triple point). This results in a decreased discharge starting voltage and improved low-voltage operability. Providing a void is also able to reduce or prevent discharge passing through the inside of the supporting electrode (hereinafter referred to as an internal discharge) and, thus, is able to reduce or prevent the degradation of the supporting electrode.

In a preferred embodiment of the present invention, a principal surface, excluding end surfaces, of the first discharge electrode and a principal surface, excluding end surfaces, of the second discharge electrode are located on different planes.

According to this preferred embodiment, the configuration in which the principal surface, excluding end surfaces, of the first discharge electrode and the principal surface, excluding end surfaces, of the second discharge electrode are located on different planes allows the thickness of the cavity to be precisely controlled.

In a preferred embodiment of the present invention, the first discharge electrode includes a first via conductor and the first via conductor is disposed so as to be exposed to the cavity.

According to this preferred embodiment, the configuration in which the first discharge electrode includes the first via conductor and the first via conductor is exposed to the cavity is able to generate not only creeping discharge but also gaseous discharge, and thus, further improved low-voltage operability. In addition, since the first via conductor is able to be formed to have a thickness, peeling-off of the discharge electrode is reduced or prevented even after repeated discharges.

In a preferred embodiment of the present invention, a void is provided in at least a portion of a boundary region between the first via conductor, the supporting electrode, and the insulating ceramic body.

According to this preferred embodiment, the ESD protection device is able to be used with the first discharge electrode being connected to the positive side and the second discharge electrode being connected to the ground side.

In a preferred embodiment of the present invention, the first discharge electrode includes a first via conductor, and the second discharge electrode includes a second via conductor, the first via conductor and the second via conductor being disposed so as to be exposed to the cavity and to face each other.

According to this preferred embodiment, since the first via conductor and the second via conductor each are able to be formed to have a thickness, peeling-off of the discharge electrodes is reduced or prevented even after repeated discharges.

In a preferred embodiment of the present invention, a void is provided in at least a portion of a boundary region between the first via conductor, the supporting electrode, and the insulating ceramic body, and a void is provided in at least a portion of a boundary region between the second via conductor, the supporting electrode, and the insulating ceramic body.

According to this preferred embodiment, the ESD protection device is able to be used with the first discharge electrode being connected to the positive side and the second discharge electrode being connected to the ground side, or with the second discharge electrode being connected to the positive side and the first discharge electrode being connected to the ground side.

In a preferred embodiment of the present invention, the supporting electrode has a toroidal shape including a through hole which defines the cavity and is disposed inside the insulating ceramic body.

According to this preferred embodiment, the configuration in which the supporting electrode has a toroidal shape including a through hole that defines the cavity and surrounds the cavity allows discharge to readily occur in the cavity.

In a preferred embodiment of the present invention, in plan view, at least one void is provided on at least one principal surface of the supporting electrode.

According to this preferred embodiment, the configuration in which the void is provided on at least one principal surface of the supporting electrode so as to surround the cavity advantageously facilitates discharge along the inner circumferential surface of the cavity, reduces or prevents discharge in the supporting electrode, and reduces the degradation of the supporting electrode.

In a preferred embodiment of the present invention, the supporting electrode has a three-layer structure including a top layer, a middle layer, and a bottom layer, and at least one of the top layer and the bottom layer includes a material more sintering-resistant than that of the middle layer.

According to this preferred embodiment, the configuration in which the supporting electrode includes multiple layers and at least one of the top layer and the bottom layer includes a sintering-resistant material facilitates the formation of a void in a boundary region between the discharge electrode and the insulating ceramic body.

In a preferred embodiment of the present invention, the middle layer has higher conductivity than at least one of the top layer and the bottom layer.

According to this preferred embodiment, the higher conductivity of the middle layer facilitates creeping discharge along the surface of the supporting electrode.

A method for producing a ESD protection device according to a preferred embodiment of the present invention includes a step of forming a first discharge electrode and a second discharge electrode on one principal surface of a first ceramic green sheet and one principal surface of a second ceramic green sheet, respectively; a step of forming a through hole defining a cavity in a supporting electrode ceramic green sheet more sintering-resistant than the first and second ceramic green sheets; a step of forming a multilayer body by laminating the first and second ceramic green sheets and the supporting electrode ceramic green sheet with the supporting electrode ceramic green sheet sandwiched between the first and second ceramic green sheets such that the first and second discharge electrodes are exposed to the through hole and that the first and second discharge electrodes partially face each other with the through hole interposed therebetween; and a step of firing the multilayer body.

According to this production method, a multilayer body is formed by laminating the first and second ceramic green sheets and the supporting electrode ceramic green sheet with the sintering-resistant supporting electrode ceramic green sheet sandwiched between the first and second ceramic green sheets and is fired. The first and second ceramic green sheets more readily shrink than the supporting electrode ceramic green sheet. By utilizing the difference in shrinkage, an ESD protection device having a void isolated from the cavity in at least a portion of a boundary region between at least one of the first and second discharge electrodes, the supporting electrode, and the insulating ceramic body is readily produced.

In a production method according to a preferred embodiment of the present invention, the supporting electrode ceramic sheet includes a material having a sintering temperature higher than those of the first and second ceramic sheets.

According to this preferred embodiment, the use of the material having a sintering temperature higher than those of the first and second ceramic sheets as the sintering-resistant supporting electrode ceramic sheet allows the void to be formed at a controlled firing temperature.

In a production method according to a preferred embodiment of the present invention, the first and second ceramic green sheets and the supporting electrode ceramic green sheet are laminated with a pore-forming agent sandwiched between the first and/or second discharge electrode and the supporting electrode ceramic green sheet.

According to this preferred embodiment, the pore-forming agent is decomposed and stripped off when the multilayer body is fired, and as a result, a void(s) is able to be formed between the first and/or second discharge electrode and the supporting electrode ceramic green sheet.

The ESD protection devices according to preferred embodiments of the present invention reduce or prevent supporting electrode degradation while improving low-voltage operability.

The above and other elements, features, steps, characteristics and advantages of the present invention will become more apparent from the following detailed description of the preferred embodiments with reference to the attached drawings.

BRIEF DESCRIPTION OF THE DRAWINGS

FIG. 8 is a schematic longitudinal sectional view of an exemplary process for producing the ESD protection device according to preferred embodiment 4 of the present invention.

FIGS. 9A to 9C are schematic plan views illustrating exemplary positions of void formation in the present invention.

DETAILED DESCRIPTION OF THE PREFERRED EMBODIMENTS

Preferred Embodiment 1

Figure 1A:
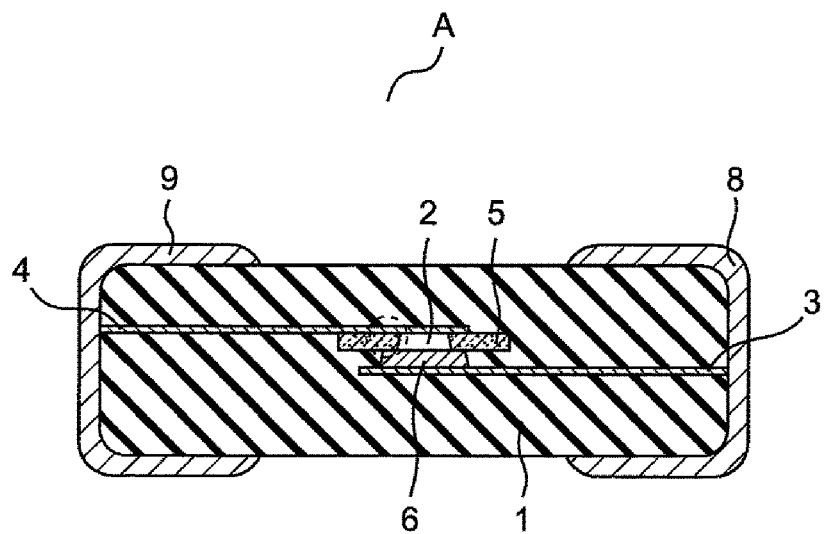
FIG. 1A is a schematic longitudinal sectional view of an ESD protection device according to preferred embodiment 1 of the present invention.

FIG. 1A is a schematic longitudinal sectional view of an exemplary structure of an ESD protection device according to preferred embodiment 1 of the present invention. An ESD protection device A includes an insulating ceramic body 1 including a cavity 2 provided therein, first and second discharge electrodes 3 and 4 disposed so as to partially face each other with the cavity 2 interposed therebetween, a first via conductor 6 at least partially exposed to the cavity 2 and defining a portion of the first discharge electrode 3, a supporting electrode 5 disposed so as to be at least partially exposed to the cavity 2 and to be electrically connected to the first and second discharge electrodes 3 and 4, and first and second outer electrodes 8 and 9 separately provided on the outer surface of the insulating ceramic body 1. The first outer electrode 8 is electrically connected to the first discharge electrode 3, and the second outer electrode 9 is electrically connected to the second discharge electrode 4. A principal surface, excluding end surfaces, of the first discharge electrode 3 and a principal surface, excluding end surfaces, of the second discharge electrode are located on different planes from one another. In the following description, portions of the first and second discharge electrodes 3 and 4 facing each other may be referred to as facing portions.

Figure 1B:
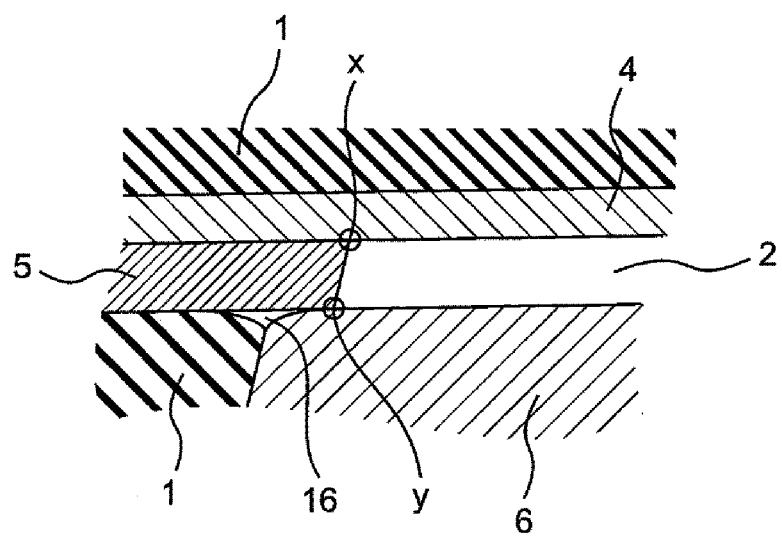
FIG. 1B is a partially enlarged view of FIG. 1A.

FIG. 1B is a partially enlarged view of the cavity 2 in FIG. 1A. A first void 16 isolated from the cavity 2 is provided in a boundary region between the first via conductor 6, the supporting electrode 5, and the insulating ceramic body 1. Circles in the figure represent creepage surface triple points x and y, which are electric field concentration points on a creepage surface.

The via conductor is preferably made of an insulating ceramic body including a via hole filled with a conductive material and defines a portion of the discharge electrode.

In general, electro-static discharge from the first discharge electrode to the second discharge electrode includes gaseous discharge through the cavity 2 and discharge through the supporting electrode 5. The discharge through the supporting electrode 5 includes creeping discharge in which a current flows on the surface of the supporting electrode 5 and discharge in which a current flows inside the supporting electrode 5. If the first void 16 is not provided, an internal triple point is provided in the boundary region between the first via conductor 6, the supporting electrode 5, and the insulating ceramic body 1, which gives rise to an internal discharge in which a current flows inside the supporting electrode 5. The internal discharge not only involves the generation of heat and mechanical impact, thus promoting the degradation of the supporting electrode, but also causes an electric field to be distributed to places other than the surface of the supporting electrode 5, which results in an increased discharge starting voltage. By contrast, in this preferred embodiment, the configuration in which the first void 16 is provided in the boundary region between the first via conductor 6, the supporting electrode 5, and the insulating ceramic body 1 reduces the electric field concentration at an internal triple point and promotes the electric field concentration at the creepage surface triple points. This results in a decreased discharge starting voltage and improved low-voltage operability. Providing a void also reduces or prevents internal discharge of the supporting electrode and, thus, reduces or prevents the degradation of the supporting electrode.

The void may be of any shape or size as long as it is isolated from the cavity and is present in the boundary region between the first or second discharge electrode (or the first or second via conductor), the supporting electrode, and the insulating ceramic body. The number of voids may be one or more than one. For example, when the supporting electrode has a toroidal shape with a through hole that defines the cavity, in plan view, one or more voids may be provided on one principal surface of the supporting electrode, as shown in FIG. 9. As shown in FIG. 9A, one ring-shaped void may be provided. As shown in FIG. 9B, a chipped void of horseshoe shape may be provided. As shown in FIG. 9C, a plurality of arched voids may be provided along the circumference of the toroidal supporting electrode. The size of the voids is, for example, in sectional view, about 0.1 µm or more and about 10 µm or less, preferably about 1 µm or more and about 5 µm or less, in length, and about 0.1 µm or more and about 10 µm or less, preferably about 1 µm or more and about 5 µm or less, in depth. Dashed lines in FIGS. 9A to 9C each indicate a boundary between the insulating ceramic body and the discharge electrode.

As a ceramic material for the insulating ceramic body 1, for example, a low temperature co-fired ceramic (LTCC) containing Ba, Al, and Si as principal components may preferably be used. The insulating ceramic body 1 may preferably contain at least one of an alkali metal component and a boron component. The insulating ceramic body 1 may further preferably contain a glass component.

The first and second discharge electrodes 3 and 4 are provided on different planes and extend in the directions of the different planes. The first and second discharge electrodes 3 and 4 may preferably, but not necessarily, have a band shape, for example. The first and second discharge electrodes 3 and 4 may preferably be made of, for example, a material such as Cu, Ag, Pd, Pt, Al, Ni, W, or an alloy containing at least one of these metals.

The supporting electrode 5 is provided so as to be at least partially exposed to the cavity 2 and to be electrically connected to the first and second discharge electrodes 3 and 4. As the supporting electrode, a ceramic body of toroidal shape including a through hole that defines the cavity may preferably be used, for example.

For the supporting electrode, a material is used that is a mixture of a conductive material and an insulating material and that is more sintering-resistant than the ceramic material for the insulating ceramic body and the material for the discharge electrodes. The insulating ceramic body and the discharge electrodes shrink upon sintering, while the supporting electrode, which is sintering-resistant, shrinks to a lesser extent than the insulating ceramic body and the discharge electrodes. As a result, in a boundary region where the supporting electrode, the insulating ceramic body, and the discharge electrode come into contact with one another, a void is provided according to the difference in shrinkage. The sintering-resistant material may be a material having a sintering temperature higher than those of the insulating ceramic body and the discharge electrodes. Specifically, the conductive material may be, for example, Cu, Ag, Pd, Pt, Al, Ni, W, or a combination thereof. The conductive material may also be a material less conductive than metal materials, such as a semiconductive material such as SiC powder or a resistive material. The semiconductive material may be, for example, a metal semiconductor, such as Si or Ge; a carbide, such as SiC, TiC, ZrC, or WC; a nitride, such as TiN, ZrN, chromium nitride, VN, or TaN; a silicide, such as titanium silicide, zirconium silicide, tungsten silicide, molybdenum silicide, or chromium silicide; a boride, such as titanium boride, zirconium boride, chromium boride, lanthanum boride, molybdenum boride, or tungsten boride; or an oxide, such as strontium titanate. Two or more of these materials may be mixed as appropriate. The conductive material may be coated with an inorganic material. The inorganic material is not particularly limited, and it may be, for example, an inorganic material, such as $Al_2O_3$, $ZrO_2$, or $SiO_2$ or a calcined powder mixture of the constituent materials for the ceramic substrate. Meanwhile, the insulating material may be, for example, an oxide, such as $Al_2O_3$, $SiO_2$, $ZrO_2$, or $TiO_2$, a nitride, such as $Si_3N_4$ or AlN, a calcined powder mixture of the constituent materials for the ceramic substrate, a vitreous material, or a combination thereof. Preferably, the insulating material is a material that exhibits high heat resistance and has a high breakdown voltage.

For the first and second outer electrodes 8 and 9, for example, a material, such as Cu, Ag, Pd, Pt, Al, Ni, W, or an alloy containing at least one of these metals may be used.

The discharge gap (the distance between facing portions of first and second discharge electrodes) of a conventional ESD protection device is about 10 μm or more and about 50 μm or less, while in the present invention, the discharge gap may be about 5 μm or more and about 20 μm or less, preferably about 6 μm or more and about 13 μm or less.

In the ESD protection device according to the present preferred embodiment, the void promotes the electric field concentration at the creepage surface triple points, which not only results in a decreased discharge starting voltage but also reduces or prevents internal discharge of the supporting electrode. As a result of this, degradation of the supporting electrode is reduced or prevented, and improved low-voltage operability is achieved. In addition, the first via conductor reduces or prevents peeling-off of the discharge electrode even after repeated discharges, leading to more stable operability.

Next, a method for producing an ESD protection device according to a preferred embodiment of the present invention will be described. The method for producing the ESD protection device according to the present preferred embodiment includes a step of forming a first discharge electrode and a second discharge electrode on one principal surface of a first ceramic green sheet and one principal surface of a second ceramic green sheet, respectively; a step of forming a through hole that defines a cavity in a supporting electrode ceramic green sheet more sintering-resistant than the first and second ceramic green sheets; a step of forming a multilayer body by laminating the first and second ceramic green sheets and the supporting electrode ceramic green sheet with the supporting electrode ceramic green sheet sandwiched between the first and second ceramic green sheets such that the first and second discharge electrodes are exposed to the through hole; and a step of firing the multilayer body. In the step of forming a first discharge electrode, a via hole is formed in the first ceramic green sheet, and the via hole is filled with a first via conductor, following which the first discharge electrode is formed so as to be partially in contact with the first via conductor.

The production method will now be described in detail with reference to FIG. 5.

(1) Step of Forming First and Second Discharge Electrodes

Onto ceramic green sheets 11 and 12, conductive paste is applied to form the first and second discharge electrodes 3 and 4. A via hole is formed in the ceramic green sheet 12, and the via hole is filled with conductive paste to form the first via conductor 6. The first discharge electrode 3 is formed so as to be partially in contact with the first via conductor 6. The formation of the via hole in the ceramic green sheet 12 and the filling of the via hole with the first via conductor 6 are performed prior to the formation of the first discharge electrode 3, and the first discharge electrode 3 is formed so as to be partially in contact with the first via conductor 6.

The first via conductor 6 has a tapered shape that becomes narrower towards the cavity 2 in sectional view. The tapered shape allows an electric field to concentrate on the side of the cavity 2, which advantageously allows discharge to readily occur.

(2) Step of Forming Through Hole Serving as Cavity in Supporting Electrode Ceramic Green Sheet A through hole 14 that defines a cavity after lamination is formed in a supporting electrode ceramic green sheet 15 provided. The through hole 14 may be of any shape, but preferably has a tapered cross-sectional shape.

(3) Step of Forming Multilayer Body

Ceramic green sheets 10, 11, 12, and 13 are laminated with the supporting electrode ceramic green sheet 15 sandwiched in between such that the first and second discharge electrodes 3 and 4 are exposed to the through hole 14, thus forming a multilayer green sheet.

The first and second ceramic green sheets and the supporting electrode ceramic green sheet may also be laminated with a pore-forming agent sandwiched between the first and/or second discharge electrode and the supporting electrode ceramic green sheet. The pore-forming agent is decomposed and stripped off during firing, and after the firing, a void is formed in a boundary region where the supporting electrode, the insulating ceramic body, and the discharge electrode come into contact with one another. Examples of the pore-forming agent include organic resins, such as acrylic resins and polystyrene resins. The organic resin may be of any shape: spherical, columnar, or indeterminate, for example.

(4) Step of Firing

The multilayer green sheet may preferably be fired in a $N_2$ atmosphere within a temperature range of from about 850° C. to about 1,000° C., for example. The firing is performed at a temperature that is higher than the sintering temperatures of the material for the ceramic green sheets and the first and second discharge electrodes and lower than the sintering temperature of the material for the supporting electrode ceramic green sheet. Although the ceramic green sheets and the first and second discharge electrodes shrink upon sintering due to the firing, since the sintering temperature of the material for the supporting electrode ceramic green sheet is higher than the firing temperature, the supporting electrode shrinks to a lesser extent than the ceramic green sheets and the first and second discharge electrodes. As a result, after the firing, a void is formed in a boundary region where the supporting electrode, the insulating ceramic body, and the discharge electrode come into contact with one another, according to the difference in shrinkage.

Preferred Embodiment 2

An ESD protection device according to preferred embodiment 2 of the present invention has the same or substantially the same structure as that of the ESD protection device according to preferred embodiment 1 except that the ESD protection device of preferred embodiment 1 includes a void in at least a portion of a boundary region between a first via conductor, a supporting electrode, and an insulating ceramic body, whereas the ESD protection device according to the present preferred embodiment includes a void in at least a portion of a boundary region between a first via conductor, a supporting electrode, and an insulating ceramic body and in at least a portion of a boundary region between a second via conductor, a supporting electrode, and an insulating ceramic body.

Figure 2A:
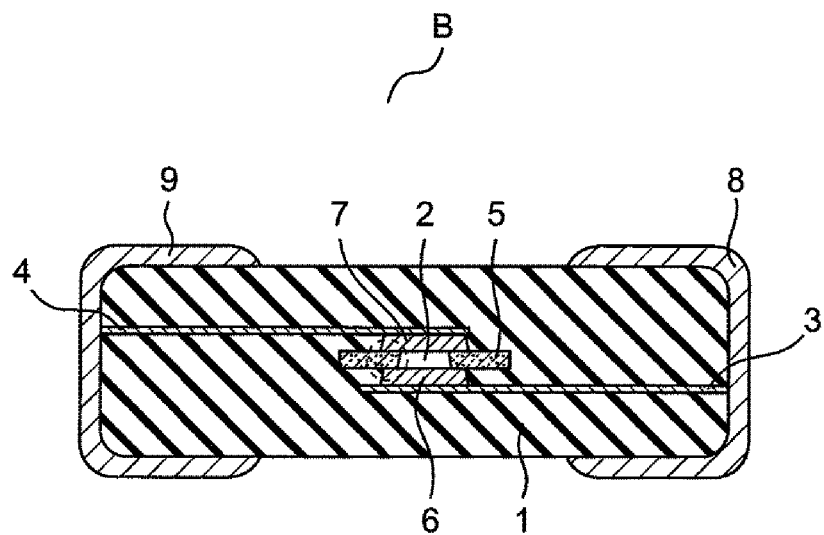
FIG. 2A is a schematic longitudinal sectional view of an ESD protection device according to preferred embodiment 2 of the present invention.
Figure 2B:
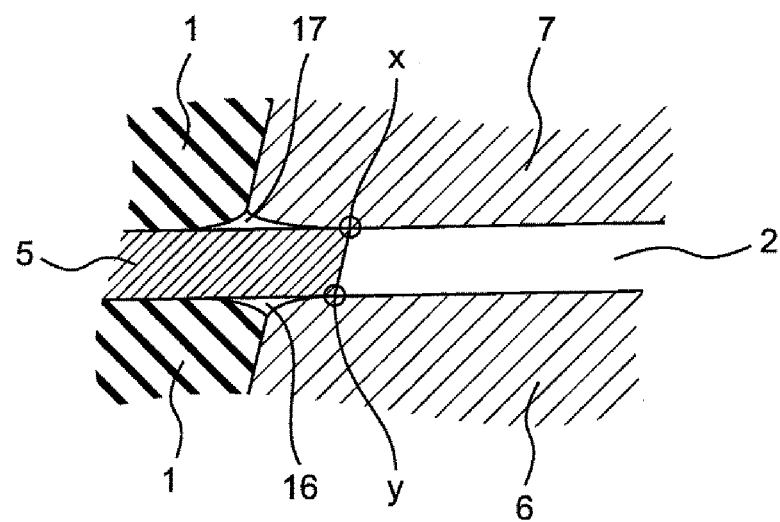
FIG. 2B is a partially enlarged view of FIG. 2A.

As shown in FIG. 2A, a first via conductor 6 and a second via conductor 7 are provided below and above a cavity 2. In FIG. 2B, which is a partially enlarged view of the cavity 2, a first void 16 is provided in a boundary region between the first via conductor 6, a supporting electrode 5, and an insulating ceramic body 1, and a second void 17 is provided in a boundary region between the second via conductor 7, the supporting electrode 5, and the insulating ceramic body 1.

Figure 6:
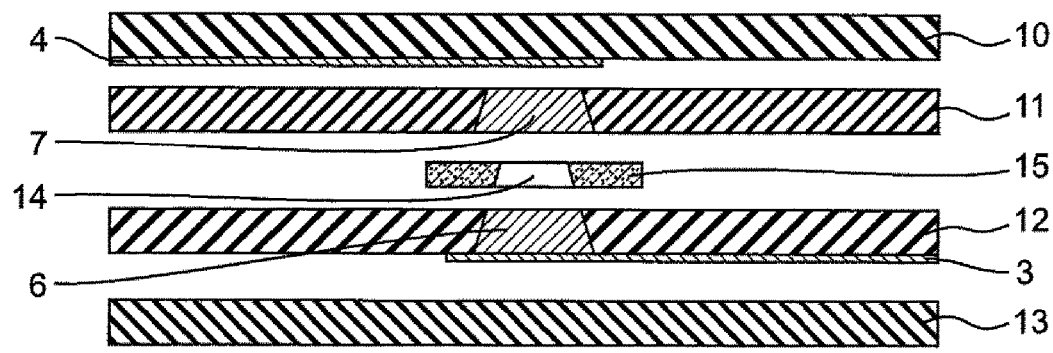
FIG. 6 is a schematic longitudinal sectional view of an exemplary process for producing the ESD protection device according to preferred embodiment 2 of the present invention.

The ESD protection device according to the present preferred embodiment may be produced by the same or substantially the same method as in preferred embodiment 1, except that in the step of forming first and second discharge electrodes, a second via conductor defining a portion of the second discharge electrode is provided in the other ceramic green sheet. FIG. 6 is a schematic sectional view of an exemplary production process. A supporting electrode ceramic green sheet 15 and a ceramic green sheet 10 including a second discharge electrode 4 provided thereon are laminated with a ceramic green sheet 11 sandwiched therebetween, the ceramic green sheet 11 including a via hole filled with the second via conductor 7.

According to the present preferred embodiment, the same or similar advantages as those of preferred embodiment 1 are provided. Moreover, the configuration in which the via conductors are provided below and above the cavity reduces or prevents both of the discharge electrodes from peeling off even after repeated discharges, leading to even more stable operability.

Preferred Embodiment 3

An ESD protection device according to preferred embodiment 3 of the present invention has the same or substantially the same structure as that of the ESD protection device according to preferred embodiment 2 except that a supporting electrode has a three-layer structure including a top layer, a middle layer, and a bottom layer. At least one of the top layer and the bottom layer contains a material more sintering-resistant than that of the middle layer, and the middle layer has higher conductivity than at least one of the top layer and the bottom layer.

Figure 3:
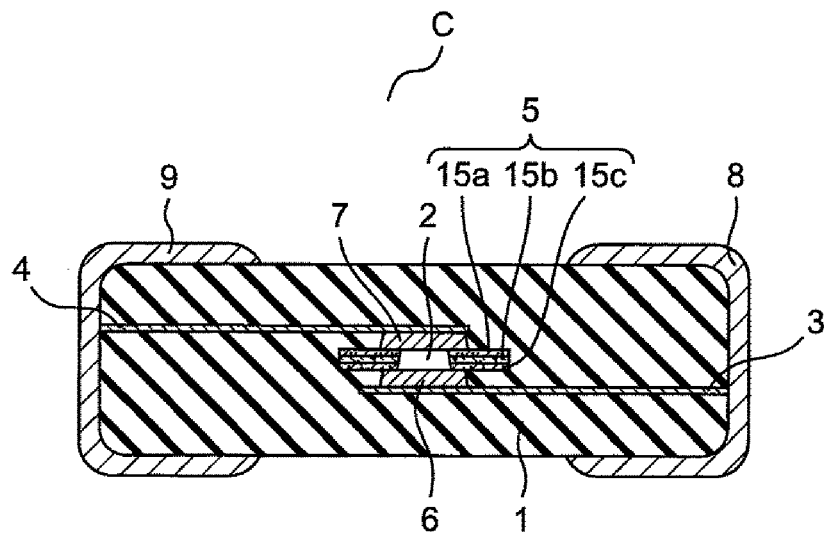
FIG. 3 is a schematic longitudinal sectional view of an ESD protection device according to preferred embodiment 3 of the present invention.

FIG. 3 shows a case of a three-layer structure in which three layers 15a, 15b, and 15c are laminated on top of one another. The top layer 15a and the bottom layer 15c are each made of a material more sintering-resistant than that of the middle layer 15b, and a material whose conductivity is higher than that of at least one of the top layer and the bottom layer is used for the middle layer. For example, a combination of metal material/insulating material is used for the top layer and/or the bottom layer, and a combination of metal material/semiconductive material/insulating material is used for the middle layer. Specifically, for example, the combination of metal material/semiconductive material/insulating material may preferably be $Cu/SiC/Al_2O_3$, and the combination of metal material/insulating material may preferably be $Cu/Al_2O_3$. When a combination of metal material/insulating material, the combined material being a sintering-resistant material, is used for the top layer 15a and the bottom layer 15c of the supporting electrode, the top layer 15a and the bottom layer 15c of the supporting electrode shrink to a lesser extent than ceramic green sheets, a first discharge electrode, and a second discharge electrode. This advantageously facilitates the formation of voids in boundary regions at which the supporting electrode, the insulating ceramic body, and the discharge electrodes come into contact with one another. When a combination of metal material/semiconductive material/insulating material, the combined material being a highly conductive material, is used for the middle layer 15b of the supporting electrode, the semiconductive material causes secondary electron emission to accelerate electron avalanche and, in turn, facilitate creeping discharge, which advantageously provides improved low-voltage operability. The top layer and/or the bottom layer may optionally include multiple layers. This configuration further facilitates the formation of voids. The middle layer may optionally include multiple layers. This configuration provides improved low-voltage operability.

Figure 7:
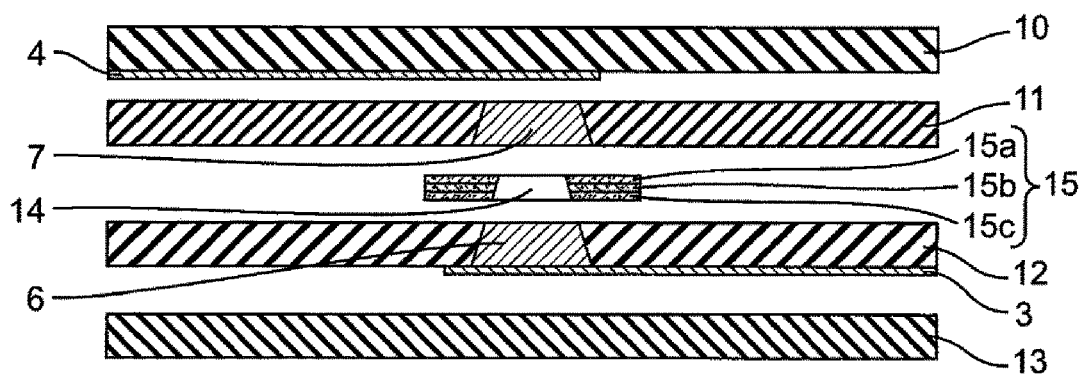
FIG. 7 is a schematic longitudinal sectional view of an exemplary process for producing the ESD protection device according to preferred embodiment 3 of the present invention.

The ESD protection device according to the present preferred embodiment may be produced by the same or substantially the same method as in preferred embodiment 2, except that in the step of forming a supporting electrode ceramic green sheet 15, a supporting electrode is formed so as to have a multilayer structure including multiple layers. FIG. 7 is a schematic sectional view of an exemplary production process. Ceramic green sheets 10, 11, 12, and 13 are laminated with the supporting electrode ceramic green sheet 15 having a multilayer structure sandwiched therebetween.

According to the present preferred embodiment, the same advantages as those of preferred embodiment 1 are provided. Moreover, the configuration in which the supporting electrode includes multiple layers and at least one of the top layer and the bottom layer contains a sintering-resistant material facilitates the formation of voids in boundary regions between the discharge electrodes and the insulating ceramic body. Furthermore, the higher conductivity of the middle layer facilitates creeping discharge along the surface of the supporting electrode.

Preferred Embodiment 4

An ESD protection device according to preferred embodiment 4 of the present invention has the same or substantially the same structure as that of the ESD protection device according to preferred embodiment 3, except that neither the first discharge electrode nor the second discharge electrode includes a via conductor.

Figure 4:
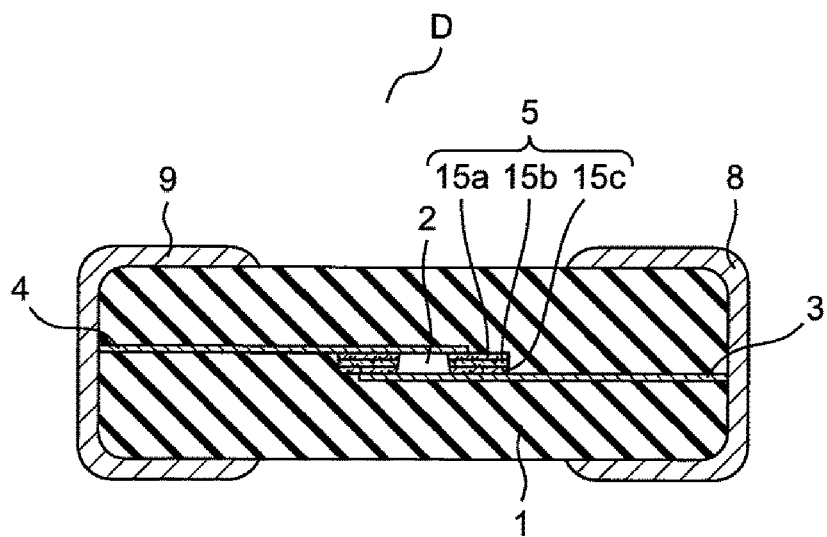
FIG. 4 is a schematic longitudinal sectional view of an ESD protection device according to preferred embodiment 4 of the present invention.

As shown in FIG. 4, first and second discharge electrodes 3 and 4 are provided below and above a cavity 2. A supporting electrode 5 has a three-layer structure in which three layers 15a, 15b, and 15c are laminated on top of one another. The three-layer structure has the same or substantially the same structure as that described in preferred embodiment 3.

The ESD protection device according to the present preferred embodiment may be produced by the same or substantially the same method as in preferred embodiment 3, except that conductive paste is applied onto ceramic green sheets 10 and 13 to form the first and second discharge electrodes 3 and 4, and the ceramic green sheets 10 and 13 are laminated with a supporting electrode ceramic green sheet 15 sandwiched therebetween such that the first and second discharge electrodes 3 and 4 are exposed to a through hole 14, thereby forming a multilayer green sheet. FIG. 8 is a schematic sectional view of an exemplary production process. The ceramic green sheets 10 and 13 are laminated with the supporting electrode ceramic green sheet 15 having a multilayer structure sandwiched therebetween.

Also in the ESD protection device according to the present preferred embodiment, the configuration in which a void isolated from the cavity is provided in at least a portion of a boundary region between at least one of the first and second discharge electrodes, the supporting electrode, and the insulating ceramic body reduces the electric field concentration at an internal triple point where at least one of the first and second discharge electrodes, the supporting electrode, and the insulating ceramic body come into contact with one another and promotes the electric field concentration at a creepage surface triple point where at least one of the first and second discharge electrodes, the cavity, and the supporting electrode come into contact with one another. This advantageously results in improved low-voltage operability and reduces or prevents the degradation of the supporting electrode. Moreover, similarly to preferred embodiment 3, the configuration in which the supporting electrode includes multiple layers and at least one of the top layer and the bottom layer contains a sintering-resistant material facilitates the formation of voids in boundary regions between the discharge electrodes and the insulating ceramic body. Furthermore, the higher conductivity of the middle layer facilitates creeping discharge along the surface of the supporting electrode.

While preferred embodiments 1 to 4 have been described in the context where a principal surface, excluding end surfaces, of the first discharge electrode and a principal surface, excluding end surfaces, of the second discharge electrode are located on different planes, an ESD protection device having a structure in which an end surface of the first discharge electrode and an end surface of the second discharge electrode are provided on the same plane so as to face each other with a cavity interposed therebetween and in which neither the first discharge electrode nor the second discharge electrode includes a via conductor provides the same or similar advantages, i.e., the configuration in which a void isolated from the cavity is provided in at least a portion of the boundary region between at least one of the first and second discharge electrodes, the supporting electrode, and the insulating ceramic body reduces the electric field concentration at an internal triple point where at least one of the first and second discharge electrodes, the supporting electrode, and the insulating ceramic body come into contact with one another and promotes the electric field concentration at a creepage surface triple point at which at least one of the first and second discharge electrodes, the cavity, and the supporting electrode come into contact with one another. This advantageously results in improved low-voltage operability and reduces or prevents the degradation of the supporting electrode.

The present invention will be described in more detail with reference to examples of preferred embodiments of the present invention, but the following examples are not intended to limit the present invention.

EXAMPLE 1

(1) Preparation of Ceramic Sheet Material

A material composed primarily including Ba, Al, and Si (an LTCC material whose relative dielectric constant $\varepsilon_r$ was adjusted to be 4 to 9) was used as a ceramic material for the ceramic sheets. The ingredients were blended and mixed in a desired composition ratio, and the mixture was calcined at about 800° C. to about 1,000° C. The obtained calcined powder was pulverized with a zirconia ball mill for about 12 hours to obtain a ceramic powder. An organic solvent, such as toluene or EKINEN, was added to the ceramic powder and mixed. A binder and a plasticizer were further added thereto and mixed to obtain a slurry. The slurry was formed by a doctor blade method to obtain four ceramic green sheets each having a thickness of about 25 μm.

(2) Preparation of Supporting Electrode Material

A material for a supporting electrode disposed between discharge electrodes was made of a mixture of $Cu/Al_2O_3$. A Cu powder having an average particle size of about 0.5 μm and an $Al_2O_3$ powder having an average particle size of about 0.1 μm were blended in a ratio of about 30% by volume to about 70% by volume, and an organic solvent, such as toluene or EKINEN, was added thereto and mixed. A binder and a plasticizer were further added thereto and mixed to obtain a slurry. The slurry was formed by a doctor blade method to obtain a supporting electrode sheet having a thickness of about 10 μm.

(3) Preparation of Via Conductor Paste Material and Discharge Electrode Paste Material (3-1) Preparation of Via Conductor Paste Material A Cu powder (about 80% by weight) having an average particle size of about 3 μm, crosslinked acrylic resin beads (about 5% by weight) having an average particle size of about 1 μm, and an organic vehicle (about 15% by weight) prepared by dissolving ethylcellulose in terpineol were blended and mixed using a triple roll to prepare a via conductor paste.

(3-2) Preparation of Discharge Electrode Paste

A Cu powder (about 40% by weight) having an average particle size of about 1 μm, a Cu powder (about 40% by weight) having an average particle size of about 3 μm, and an organic vehicle (about 20% by weight) prepared by dissolving ethylcellulose in terpineol were blended and mixed using a triple roll to prepare a discharge electrode paste.

(3-3) Preparation of Paste for Forming Cavity

Crosslinked acrylic resin beads (about 38% by weight) having an average particle size of about 1 μm and an organic vehicle (about 62% by weight) obtained by dissolving about 10 wt % Ethocel resin in terpineol were blended and mixed using a triple roll to prepare a paste for forming a cavity.

(3-4) Preparation of Outer Electrode Paste

A Cu powder (about 80% by weight) having an average particle size of about 1 μm, a borosilicate alkali glass frit (about 5% by weight) having a transition temperature of about 620° C., a softening point of about 720° C., and an average particle size of about 1 μm, and an organic vehicle (about 15% by weight) prepared by dissolving ethylcellulose in terpineol were blended and mixed using a triple roll to prepare an outer electrode paste.

(4) Via Hole Formation by Laser Beam Machining and Filling

One of the ceramic green sheets and the supporting electrode sheet were each perforated with a via hole using a $CO_2$ laser. The via hole formed in the ceramic green sheet had an incident φ of about 130 μm (an outgoing φ of about 120 μm) and was filled with the via conductor paste. The via hole formed in the supporting electrode sheet had an incident φ of about 100 μm (an outgoing φ of about 95 μm) and was filled with the paste for forming a cavity. The supporting electrode sheet was then cut out to a predetermined size and used for the formation of a discharge portion in lamination.

(5) Application of Discharge Electrode by Screen Printing

The discharge electrode paste was applied and formed by screen printing. The discharge electrode paste was applied to one of the ceramic green sheets not perforated with a via hole and to the ceramic green sheet perforated with a via hole filled with a via and was extended out.

(6) Lamination and Pressure Bonding

Figure 5:
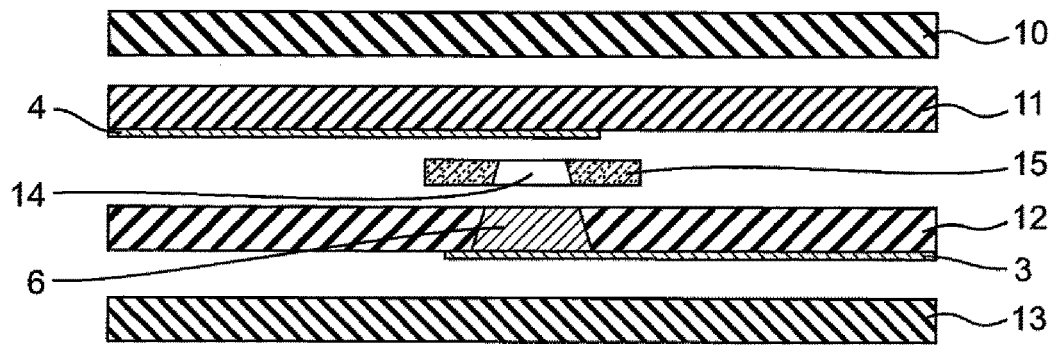
FIG. 5 is a schematic longitudinal sectional view of an exemplary process for producing the ESD protection device according to preferred embodiment 1 of the present invention.

As shown in FIG. 5, the ceramic green sheets 10, 11, 12, and 13 were laminated such that the supporting electrode ceramic green sheet 15 was sandwiched between the ceramic green sheet 11 including the second discharge electrode 4 formed thereon and the ceramic green sheet 12 including a via hole filled with the first via conductor 6 and also including the first discharge electrode 3 formed thereon. The ceramic green sheets were pressure bonded to fabricate a multilayer body. The ceramic green sheets 10, 11, 12, and 13 were laminated such that a portion of the first discharge electrode and the first via conductor 6 faced each other with the through hole 14 interposed therebetween. In this example, the lamination and pressure bonding was performed so as to give a multilayer body thickness of about 0.3 mm.

(7) Cutting

As in the case of chip-type electronic components, such as LC filters, the multilayer body was cut with a micro-cutter into chips. In this example, the cutting was performed so as to provide a chip size of about 1.0 mm long and about 0.5 mm wide.

(8) Firing

Next, as in the case of standard ceramic multilayer components, the chip was fired in a $N_2$ atmosphere. In the case of a non-oxidizing electrode material, the firing may be performed in an air atmosphere. Since the sintering temperature of the ceramic green sheets each including a discharge electrode formed thereon was about 900° C. and the sintering temperature of the supporting electrode sheet was about 1,000° C. or higher, the firing temperature was set to about 950° C.

(9) Electrode Application to End Surface and Baking

After the firing, the electrode paste was applied to end surfaces and baked to form outer electrodes.

(10) Plating

The outer electrodes were subjected to electrolytic nickel plating and electrolytic tin plating.

Through the above process, an ESD protection device in which the via conductor was disposed on one side of the cavity along the thickness of the multilayer body was completed. The discharge gap (the distance between the discharge electrodes) was about 10 μm. Also in the following Examples and Comparative Example, the discharge gap was about 10 μm, unless otherwise specified.

EXAMPLE 2

In this example, an ESD protection device was produced that includes via conductors disposed on both sides of a cavity along the thickness of a multilayer body.

Specifically, the ESD protection device was produced in the same or substantially the same manner as in Example 1, except that in the step of lamination and pressure bonding described above, as shown in FIG. 5, multiple ceramic green sheets were laminated such that a supporting electrode sheet was sandwiched between a ceramic green sheet including a via hole filled with a via conductor and also including a first discharge electrode formed thereon and a ceramic green sheet including a via hole filled with a via conductor and also including a second discharge electrode formed thereon, and the ceramic green sheets were pressure bonded to fabricate a multilayer body.

EXAMPLE 3

In this example, an ESD protection device was produced that includes via conductors disposed on both sides of a cavity along the thickness of a multilayer body and that includes a supporting electrode having a three-layer structure.

Specifically, the ESD protection device was produced in the same or substantially the same manner as in Example 2 except that the following method was used for the step of preparation of supporting electrode material described above.

Two types of supporting electrode materials A and B were provided.

The supporting electrode material A was made of a mixture of $Cu/Al_2O_3$. A Cu powder having an average particle size of about 0.5 μm and an $Al_2O_3$ powder having an average particle size of about 0.1 μm were blended in a ratio of about 30% by volume to about 70% by volume, and an organic solvent, such as toluene or EKINEN, was added thereto and mixed. A binder and a plasticizer were further added thereto and mixed to obtain a slurry.

The supporting electrode material B was made of a mixture of Cu/SiC/Al$_2$O$_3$. A Cu powder having an average particle size of about 0.5 µm, a SiC powder having an average particle size of about 0.5 µm, and an Al$_2$O$_3$ powder having an average particle size of about 0.1 µm were blended in a ratio of about 30% by volume to about 50% by volume to about 20% by volume, and an organic solvent, such as toluene or EKINEN, was added thereto and mixed. A binder and a plasticizer were further added thereto and mixed to obtain a slurry.

The slurries were each formed by a doctor blade method to produce supporting electrode sheets A and B. The supporting electrode sheet B was laminated on the supporting electrode sheet A, and another supporting electrode sheet A was laminated on the supporting electrode sheet B. The laminated supporting electrode sheets were pressure bonded to obtain a multilayer supporting electrode sheet having a three-layer structure and a thickness of about 10 µm.

EXAMPLE 4

In this example, an ESD protection device was produced in the same or substantially the manner as in Example 3 except that no via conductors were formed on both sides of a cavity.

Comparative Example 1

An ESD protection device was produced in the same or substantially the same manner as in Example 2 except that a mixture of Cu and a BAS material was used as a supporting electrode material.

The discharge starting voltage of the ESD protection devices produced was measured as follows: in accordance with Electrostatic discharge immunity test specified in IEC standards (IEC61000-4-2), a voltage of about 1.5 kV to about 3.0 kV was applied through contact discharge to measure an operation rate. For each of Examples and Comparative Example, 100 samples were evaluated. The operation rate herein refers to a ratio of the number of samples that discharge at a predetermined voltage to the total number of samples.

The ESD protection devices produced were evaluated for resistance to repeated discharges. Specifically, in accordance with Electrostatic discharge immunity test specified in IEC standards (IEC61000-4-2), a voltage of about 8 kV or about 10 kV was applied through contact discharge repeatedly 100 times. Samples whose IR values decreased to about 10 kΩ were determined to be defectives and samples whose IR values did not decrease to about 10 kΩ were determined to be non-defectives, and non-defective rates were compared. For each of Examples and Comparative Example, 50 samples were evaluated. The non-defective rate herein refers to a ratio of the number of samples determined to be non-defectives to the total number of samples.

In Comparative Example 1, the operation rate at about 1.5 kV was about 10% or less. By contrast, in Examples 1 to 4, operation rates at about 1.5 kV of about 30% or more were achieved. Particularly in Example 3, an operation rate of about 50% or more was achieved. For the IR degradation resistance, the non-defective rate at about 10 kV was about 10% or less in Comparative Example 1, whereas non-defective rates of about 50% or more were achieved in Examples 1 to 4.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. An ESD protection device comprising:
   an insulating ceramic body including a cavity;
   first and second discharge electrodes disposed so as to partially face each other with the cavity interposed therebetween; and
   a supporting electrode disposed so as to be at least partially exposed to the cavity and to be electrically connected to the first and second discharge electrodes; wherein
   at least one void isolated from the cavity is provided in at least a portion of a boundary region between at least one of the first and second discharge electrodes, the supporting electrode, and the insulating ceramic body.

2. The ESD protection device according to claim 1, wherein a principal surface, excluding end surfaces, of the first discharge electrode and a principal surface, excluding end surfaces, of the second discharge electrode are located on different planes.

3. The ESD protection device according to claim 2, wherein the first discharge electrode includes a first via conductor and the first via conductor exposed to the cavity.

4. The ESD protection device according to claim 3, wherein the at least one void is provided in at least a portion of a boundary region between the first via conductor, the supporting electrode, and the insulating ceramic body.

5. The ESD protection device according to claim 2, wherein the first discharge electrode includes a first via conductor, and the second discharge electrode includes a second via conductor, the first via conductor and the second via conductor being exposed to the cavity and facing each other.

6. The ESD protection device according to claim 5, wherein a first void of the at least one void is provided in at least a portion of a boundary region between the first via conductor, the supporting electrode, and the insulating ceramic body, and a second void of the at least one void is provided in at least a portion of a boundary region between the second via conductor, the supporting electrode, and the insulating ceramic body.

7. The ESD protection device according to claim 1, wherein the supporting electrode has a toroidal shape including a through hole that defines the cavity and is disposed inside the insulating ceramic body.

8. The ESD protection device according to claim 7, wherein at least one of the at least one void is provided on at least one principal surface of the supporting electrode.

9. The ESD protection device according to claim 1, wherein the supporting electrode has a multilayer structure including a top layer, a middle layer, and a bottom layer, and at least one of the top layer and the bottom layer contains a material more sintering-resistant than that of the middle layer.

10. The ESD protection device according to claim 9, wherein the middle layer has higher conductivity than at least one of the top layer and the bottom layer.

11. A method for producing the ESD protection device according to claim 1, comprising:
    a step of forming a first discharge electrode and a second discharge electrode on one principal surface of a first ceramic green sheet and one principal surface of a second ceramic green sheet, respectively;

a step of forming a through hole defining a cavity in a supporting electrode ceramic green sheet more sintering-resistant than the first and second ceramic green sheets;

a step of forming a multilayer body by laminating the first and second ceramic green sheets and the supporting electrode ceramic green sheet with the supporting electrode ceramic green sheet sandwiched between the first and second ceramic green sheets such that the first and second discharge electrodes are exposed to the through hole and that the first and second discharge electrodes partially face each other with the through hole interposed therebetween; and a step of firing the multilayer body.

12. The production method according to claim 11, wherein the supporting electrode ceramic green sheet contains a material having a sintering temperature higher than sintering temperatures of the first and second ceramic green sheets.

13. The production method according to claim 12, wherein the first and second ceramic green sheets and the supporting electrode ceramic green sheet are laminated with a pore-forming agent sandwiched between the first and/or second discharge electrode and the supporting electrode ceramic green sheet.

14. The production method according to claim 11, wherein a principal surface, excluding end surfaces, of the first discharge electrode and a principal surface, excluding end surfaces, of the second discharge electrode are located on different planes.

15. The production method according to claim 11, wherein the first discharge electrode is formed to include a first via conductor and the first via conductor is formed so as to be exposed to the cavity.

16. The production method according to claim 11, wherein the first discharge electrode is formed to include a first via conductor, and the second discharge electrode is formed to include a second via conductor, the first via conductor and the second via conductor being disposed so as to be exposed to the cavity and to face each other.

17. The production method according to claim 11, wherein the supporting electrode ceramic green sheet is formed to have a toroidal shape including a through hole that defines the cavity and is disposed the first and second ceramic green sheets.

18. The production method according to claim 11, wherein the supporting electrode ceramic green sheet has a multilayer structure including a top layer, a middle layer, and a bottom layer, and at least one of the top layer and the bottom layer contains a material more sintering-resistant than that of the middle layer.

19. The production method according to claim 18, wherein the middle layer has higher conductivity than at least one of the top layer and the bottom layer.

* * * * *